(12) United States Patent
Massey

(10) Patent No.: US 7,073,114 B2
(45) Date of Patent: Jul. 4, 2006

(54) METHOD OF DECODING UTILIZING A RECURSIVE TABLE-LOOKUP DECODING METHOD

(76) Inventor: Peter C. Massey, 53281 Martin La., South Bend, IN (US) 46635

( * ) Notice: Subject to any disclaimer, the term of this patent is extended or adjusted under 35 U.S.C. 154(b) by 371 days.

(21) Appl. No.: 10/601,948

(22) Filed: Jun. 23, 2003

(65) Prior Publication Data
US 2004/0025106 A1    Feb. 5, 2004

Related U.S. Application Data

(60) Provisional application No. 60/391,092, filed on Jun. 24, 2002.

(51) Int. Cl.
*H03M 13/00* (2006.01)
(52) U.S. Cl. .................... 714/755; 714/759
(58) Field of Classification Search ............ 714/759, 714/755
See application file for complete search history.

(56) References Cited

U.S. PATENT DOCUMENTS

| | | | |
|---|---|---|---|
| 5,446,747 A | 8/1995 | Berrou | |
| 5,487,075 A | 1/1996 | Caire et al. | |
| 6,023,783 A | 2/2000 | Divsalar et al. | |
| 6,128,765 A | 10/2000 | Ross et al. | |
| 6,192,501 B1 | 2/2001 | Hladik et al. | |
| 6,252,917 B1 * | 6/2001 | Freeman | 375/340 |
| 6,292,918 B1 | 9/2001 | Sindhushayana et al. | |
| 6,304,995 B1 | 10/2001 | Smith et al. | |
| 6,304,996 B1 | 10/2001 | Van Stralen et al. | |
| 6,400,290 B1 | 6/2002 | Langhammer et al. | |
| 6,499,128 B1 | 12/2002 | Gerlach et al. | |
| 6,510,536 B1 | 1/2003 | Crozier et al. | |
| 6,525,680 B1 | 2/2003 | Yamamoto et al. | |
| 6,542,559 B1 | 4/2003 | Wolf | |
| 6,725,409 B1 * | 4/2004 | Wolf | 714/755 |
| 6,785,859 B1 * | 8/2004 | Goldman | 714/755 |
| 6,868,518 B1 * | 3/2005 | Yuan et al. | 714/759 |
| 6,892,335 B1 * | 5/2005 | Gueguen | 714/701 |

OTHER PUBLICATIONS

Berrou et al., "Near Shannon limit error-correcting coding and decoding: Turbo-codes", Proc. 1993 IEEE Intern'l Conf. on Commun.,May 1993,pp. 1064-1070,Geneva, Switzerland.

(Continued)

*Primary Examiner*—Guy Lamarre
*Assistant Examiner*—Mujtaba K. Chaudry

(57) ABSTRACT

A recursive table-lookup decoding method for decoding a convolutional block code by approximating the well-known MAP, LOG-MAP, APP and BCJR decoding algorithms to obtain approximations for the a-posteriori estimates and the extrinsic estimates for the block of information bits; and a method of decoding a turbo code or a parallel-concatenated convolutional code (PCCC) to obtain a block of decoded bits for the information bits. The turbo decoding method utilizes the recursive table-lookup decoding method to decode the constituent convolutional sub-codes of a turbo code or PCCC. Hardware implementations may not require a processor.

17 Claims, 10 Drawing Sheets

OTHER PUBLICATIONS

Bahl, Cooke, Jelinik, and Raviv, "Optimal decoding of linear codes for minizing symbol error rate", IEEE Trans. on Information Theory, Mar. 1974, pp. 284-287, vol. IT-20, USA.

P.C. Massey and D. Costello Jr., "New Low-Complexity Turbo-Like Codes", Proc. 2001 IEEE Information Theory Workshop, Sep. 2-7, 2001, pp. 70-72, Cairns, Australia.

Massey, Costello, "Iterative Table-Lookup Decoding for a 2-state Rate=1/2 Turbo-like Code", Proc. 2002 IEEE Int'l Symp. on Inform. Theory, Jun. 30-Jul 5, 2002, pp. 340, Switzerland.

\* cited by examiner

NOTATION

THE BASE-CODEWORD CONSISTS OF ALL
PUNCTURED AND UNPUNCTURED CODE SYMBOLS.

PARTITIONING OF BASE – CODEWORD
INTO VECTOR–PARAMETERS.

VECTOR–PARAMETERS CONTAIN Z PARAMETERS.
EACH PARAMETER CONTAINS A BINARY BYTE OF DATA.

BYTES OF QA BITS    BYTES OF QP BITS    BYTES OF QP BITS

ADDITIONAL VECTOR–PARAMETERS IN DECODING METHOD.

LET X REPRESENT THE VECTOR-PARAMETERS:
A, E1, E2, E3, E4, P1, P2, P3, P4, N, F.

NOTATION FOR SEQUENTIAL TIME-INDEX ORDERING.

FOR INTERLEAVERS V2, V3, AND V4,
NOTATION FOR INTERLEAVED TIME-INDEX ORDERINGS.

METHOD OF DECODING UTILIZING A RECURSIVE TABLE-LOOKUP DECODING METHOD

CROSS REFERENCE TO RELATED APPLICATION

U.S. Provisional Application for patent 60/391,092, filed Jun. 6, 2002, which is hereby incorporated by reference. Applicant claims priority pursuant to 35 U.S.C. Par. 119(e)(i).

STATEMENT REGARDING FEDERALLY SPONSORED RESEARCH OR DEVELOPMENT

Not Applicable.

REFERENCE TO SEQUENCE LISTING

Not Applicable.

BACKGROUND OF THE INVENTION

1. Field of the Invention

This invention relates to the decoding of a particular class of error-correcting codes. More specifically, the invention is an algorithm and a method that decodes parallel-concatenated convolutional codes.

2. Description of Related Art

There are several types of concatenated convolutional codes (CCC's), but the most common is parallel-concatenated convolutional codes (PCCC's) which includes so-called turbo codes introduced by Berrou, et al. ("Near Shannon limit error-correcting coding and decoding: Turbo-codes", ICC'93, Conf Rec. pp. 1064–1070, Geneva, May 1993). The prior art of decoding of PCCC's is to use an iterative method of decoding that combines seperate estimates from each constituent subcode whereby each constituent convolutional subcode is decoded by a trellis-based maximum-a-posteriori (MAP) decoder that implements the so-called "forward-backward BCJR algorithm" to obtain the estimates (Bahl, et al.,"Optimal decoding of linear codes for minimizing symbol error rate", IEEE Transactions on Information Theory, Vol.20, pp. 284–287, March 1974). The maximum a posteriori (MAP) algorithm, the BCJR algorithm, the forward-backward algorithm, and the APP algorithm are all the same equivalent decoding method. The same algorithm with log-likelihood ratios, also called reliabilities, replacing probabilties are called the log-MAP algorithm and the log-APP algorithm. No matter what the algorithm is called that produces the a posteriori estimates for information bits of a binary convolutional code when given channel values and a priori estimates, the MAP/BCJR algorithm requires mathematical/computational processing for mathematical functions such as multiplications, additions, divisions, logarithms, and exponentiations. The current state-of-the-art decoders for PCCC's all require a mathematical/computational processor to implement the MAP/BCJR algorithm and to combine the estimates from the seperate constituent subcodes. The computation within the MAP/BCJR algorithm can be quite extensive, so an iterative decoder for PCCC's which is computing the MAP/BCJR algorithm for each constituent subcode at each iteration can be impractical for many high-speed low-cost communication systems. There is a need for a decoding method for PCCC's that does not require a mathematical/computational processor.

Related Patent Documents

Many patent documents just refer to the mathematical/computational processor as 'decoders', 'processors', 'calculators', , 'computing circuitry', etc. (see U.S. Pat. Nos. 5,446,747; 6,023,783). Some patent documents describe attempts to streamline the decoding by using several mathematical/computational processors or by using pipelined processors or arrays of processors (see U.S. Pat. Nos. 5,487,075; 6,304,995; 6,252,917; 6,292,918; 6,128,765; 6,304,996; 6,192,501), Another two patent documents describe computing the max-log-MAP algorithm instead of the log-MAP algorithm (see U.S. Pat. Nos. 6,510,536; 6,525,680). Another patent document describes implementing the computing circuitry on a programmable logic device (see U.S. Pat. No. 6,400,290). All the current state-of-the-art decoders require at least one mathematical/computational processor for comuting some mathematical functions within the BCJR algorithm and the combining of estimates.

Another approach for a decoder of a PCCC is based on the parity-check decoders for low density parity check codes (see U.S. Pat. Nos. 6,542,559; 6,499,128). These graph-based decoders are not closely related to trellis-based MAP/BCJR decoders and they do not perform as well on the constituent convolutional codes comprising a PCCC.

Other References:

Peter C. Massey and D. Costello Jr., "Iterative Table-Lookup Decoding for a 2-state Rate=½ Turbo-like Code", Proceedings of the 2002 IEEE International Symposium on Information Theory, Lausanne, Switzerland, pp. 340, June, 2002.

Peter C. Massey and D. Costello Jr., "New Low-Complexity Turbo-Like Codes", Proceedings of the 2001 IEEE Information Theory Workshop, Cairns, Australia, pp. 70–72, September 2001.

L. R. Bahl, J. Cooke, F. Jelinik, and J. Raviv, "Optimal decoding of linear codes for minimizing symbol error rate", IEEE Transactions on Information Theory, Vol.20, pp. 284–287, March 1974.

BRIEF SUMMARY OF THE INVENTION

The invention is a method of decoding parallel-concatenated convolutional codes (PCCC's). The invention also includes a recursive table-lookup algorithm. The method of decoding does not require a mathematical processor as do other methods of decoding PCCC's. The invention's method of decoding PCCC's consists of quantizing code bit symbols, then performing the invention's recursive table-lookup decoding algorithm for each constituent subcode in an iterative process until a specific number of iterations has been performed, at which point the most significant bits from a vector of binary bytes are taken as the hard-decision-wise decoded information bits for a PCCC.

An important part of the invention's method of decoding is the invention's recursive table-lookup decoding algorithm for each constituent subcode. This algorithm recursively reads from a set of lookup-tables that are pre-stored with binary bytes of data. The binary address words for reading the entries of the lookup-tables are formed by concatenating together seperate binary bytes that are either found in previous recursions, stored from previous iterations, or from quantized code bits. The invention's recursive table-lookup decoding algorithm can be made to approximate the well-known BCJR algorithm by appropriately pre-storing the set of lookup-tables. More precisely, the set of lookup-tables are pre-stored with binary data bytes whose values are determined ahead of time by specific inherent functions of quantized parameter values that are inherent to each entry's binary address word. Moreover, approximations to modified versions of the BCJR algorithm can be implemented by appropriately pre-storing the set of lookup-tables. The main version of the invention's recursive table-lookup decoding algorithm uses a set of five seperate lookup-tables, however a version which uses only two seperate lookup-tables is also described.

For a special class of PCCC's utilizing only 2-state constituent encoders (2-state PCCC's), the sizes of the functional lookup-tables can be reasonably small when appropriate quantization functions are utilized for both the code symbol quantization and the internal inherent parameter quantization within the recursive table-lookup decoding algorithm.

The method of decoding can be implemented in software or can be implemented in hardware without the requirement of a mathematical processor.

DETAILED DESCRIPTION OF THE INVENTION

The invention is a method of decoding parallel-concatenated convolutional codes (PCCC's). The invention also consists of a recursive table-lookup algorithm. The invention's method of decoding PCCC's produces decoded estimates that are approximations to decoded aposteriori estimates. The method of decoding does not require a mathematical processor to compute such things as additions, multiplications, or exponentiations. To faciliate the description of the invention, the method of decoding is described for an example of a four-parallel PCCC (4-PCCC) using an extended-serial mode of decoding. This example should not be considered as a limitation to the invention. The invention's method of decoding is extrapolated in a straightforward manner to decode PCCC's with any number of parallel constituent subcodes.

Background for a PCCC Encoder (Prior Art)

Figure 1:
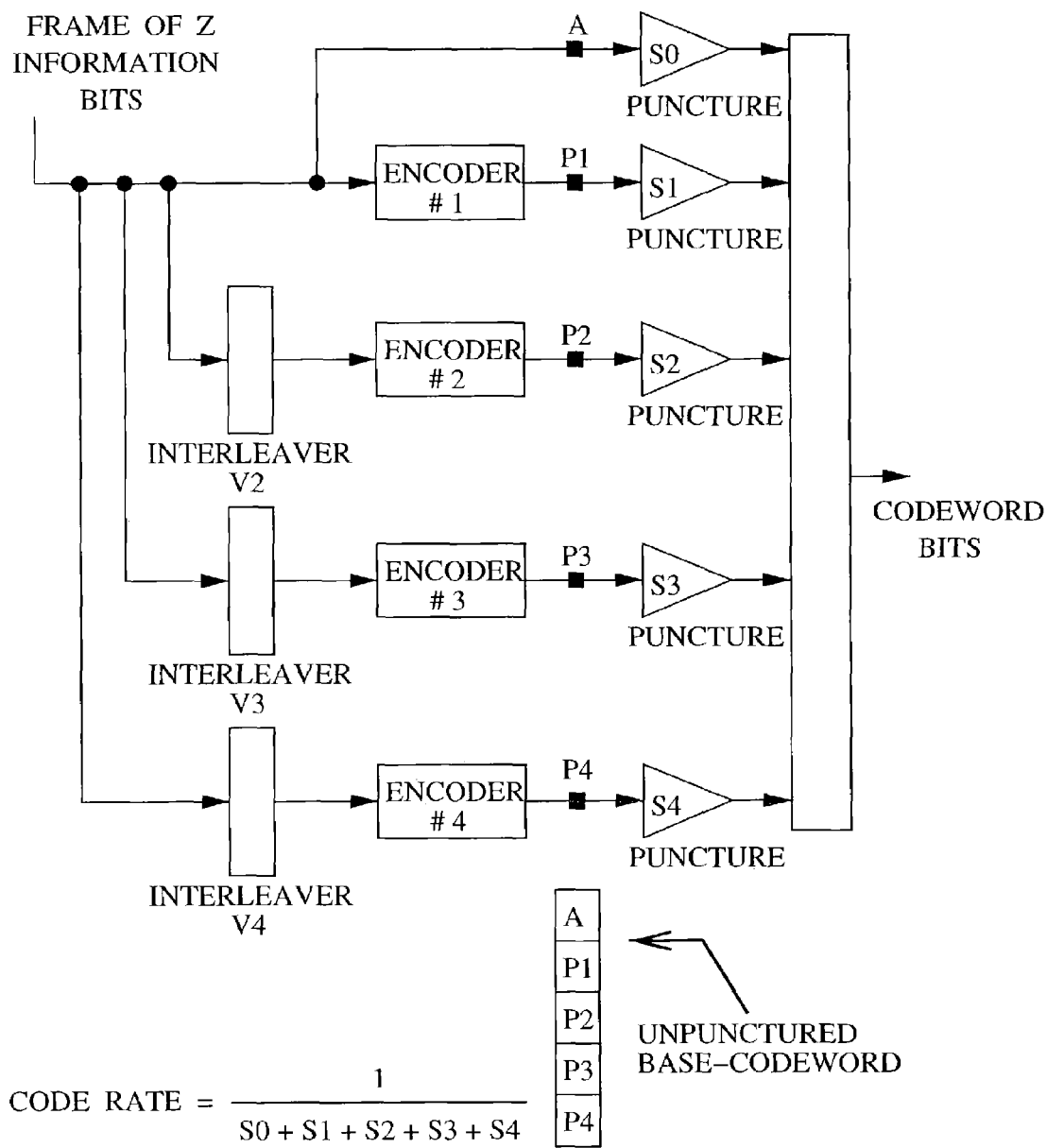
FIG. 1 is a block diagram of an encoder for a 4-parallel PCCC (Prior Art).

The structure of an encoder for a four-parallel example of a PCCC is shown in FIG. 1. Black dots at an intersection of lines indicates a connection. A frame of Z information bits is encoded by four convolutional encoders creating four parallel constituent subcodes. The frame of information bits is interleaved differently before being encoded by each constituent encoder. By convention, the frame of information bits is not interleaved for the first constituent encoder (i.e., a trivial interleaver), so the sequential time-index ordering of K=0 to K=Z−1 is used to describe the ordering of information bits. The interleavers are labeled as V2, V3, and V4. The interleaved time-index orderings for the second, third, and fourth constituent subcodes are described by the notations V2[K], V3[K], and V4[K] for K=0 to K=Z−1. A base-codeword is to be defined as the collection of all possible outputs of the PCCC before any puncturing occurs, so it consists of the frame of information bits in vector A along with frames of parity bits in vectors P1, P2, P3, and P4 corresponding to each parallel constituent subcode. The output codeword for a PCCC is created as a result of not sending all the binary bits of the base-codeword. This is known as puncturing. The amount of puncturing is inversely indicated in FIG. 1 by the ratios S0, S1, S2, S3, S4 which represent the ratio that each frame of bits is included in the output codeword. A ratio value equal to one indicates that the entire corresponding frame of Z bits is included in the codeword, while a ratio value of zero indicates that all Z bits are punctured and hence not included in the codeword. The code rate of a PCCC is the inverse of the sum of these ratios.

Some Notation

In this detailed description of the invention's method of decoding for a PCCC, several different types of parameters will be used. Each and every parameter is considered to consist of a binary byte of data. A vector of the parameter data bytes is refered to as a vector-parameter. The terms "storing", "containing", and "reading" are used for the parameters in this description. Some notation for vector-parameters is shown in FIG. 2B for the vector-parameters A, P1, P2, P3, and P4, which correspond to similarly labeled vectors within the base-codeword of a PCCC (as shown in FIG. 1). Additional vector-parameters of E1, E2, E3, E4, N, F, and R will be used in the description. Each vector-parameter is a Z length vector of parameters whose individual parameter bytes are referenced by a time-index K from K=0 to K=Z−1. Different types of vector-parameters may contain binary bytes consisting of different numbers of binary bits. The vector-parameter A contains binary bytes consisting of QA bits (QA-bytes) and the vector-parameters P1, P2, P3, and P4 contain binary bytes consisting of QP bits (QP-bytes). The vector-parameters E1, E2, E3, and E4 contain binary bytes of QE bits (QE-bytes) and the vector-parameter N contains binary bytes of QN bits (QN-bytes). The vector-parameter F contains binary bytes of QS bits (QS-bytes). Other parameters that are used in variations of the decoding method will be described as they become necessary. Each parameter type is assigned an inherent quantization function and an inherent labeling function. The inherent functions create a conversion between the possible binary combinations for a byte stored at a parameter and real-valued quantization levels. The inherent quantization functions and labeling functions for the parameters are not used directly in the invention's method of decoding, however they are used inherently when the lookup-tables of the invention are to be pre-stored with binary data bytes.

Overview of the Method of Decoding a PCCC

Figure 2A:
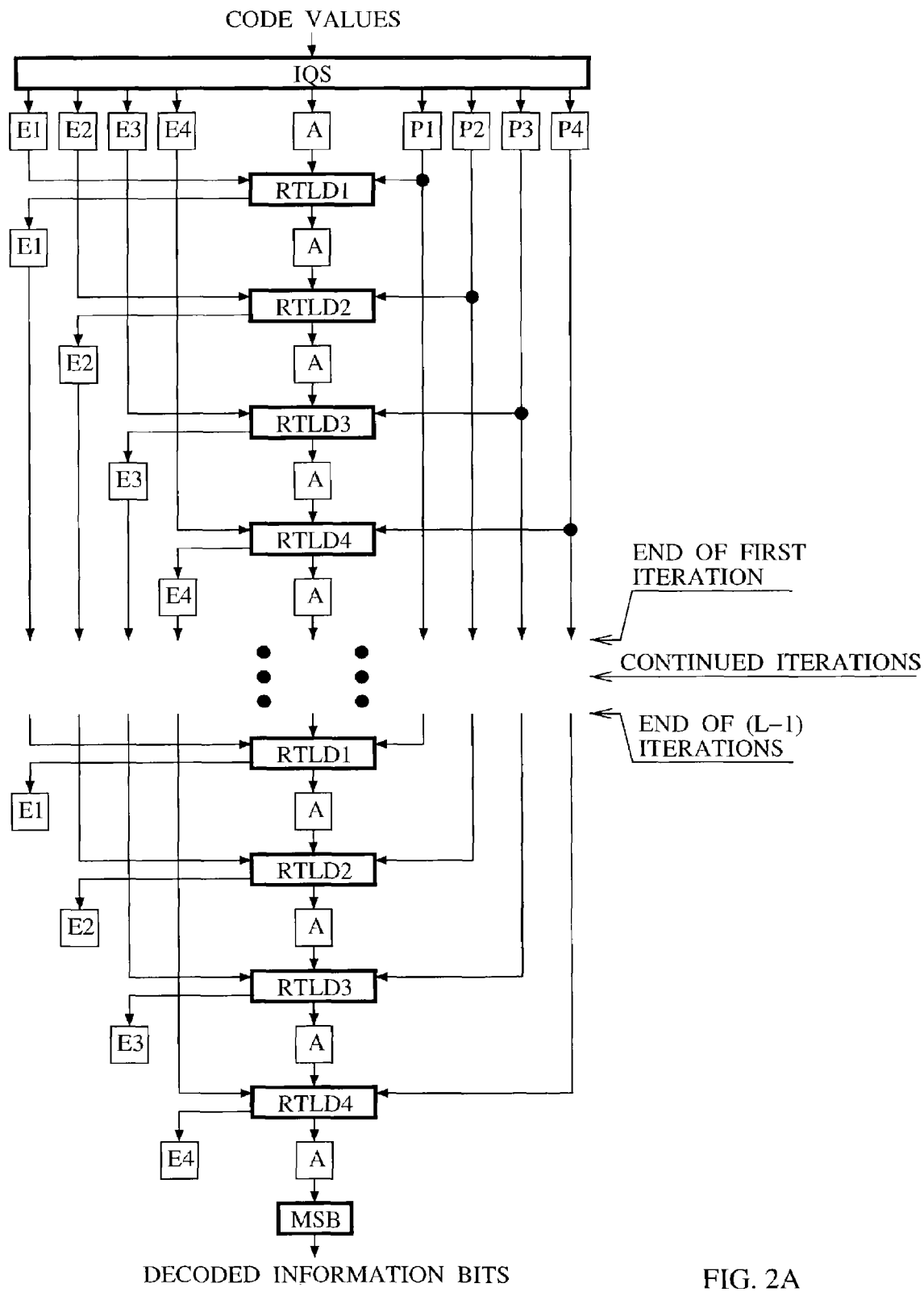
FIG. 2A is a block diagram of the invention's method of decoding for a 4-parallel PCCC.
Figure 2B:
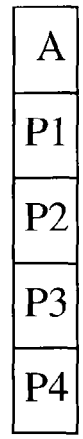
FIG. 2B shows some notation for representing vectors of parameters that are used in the description for the invention's method of decoding for a 4-parallel PCCC in FIG. 2A.
Figure 2B:
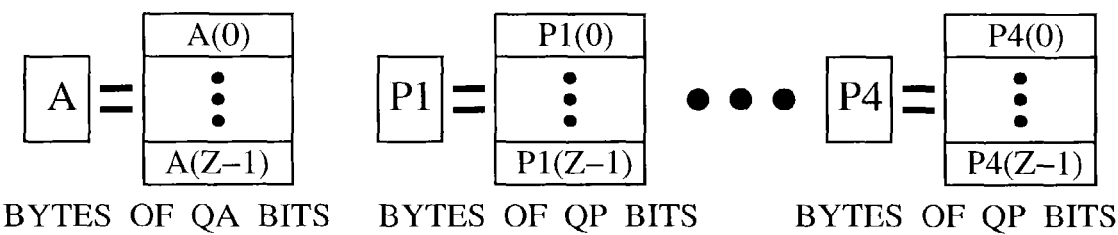
Figure 2B:
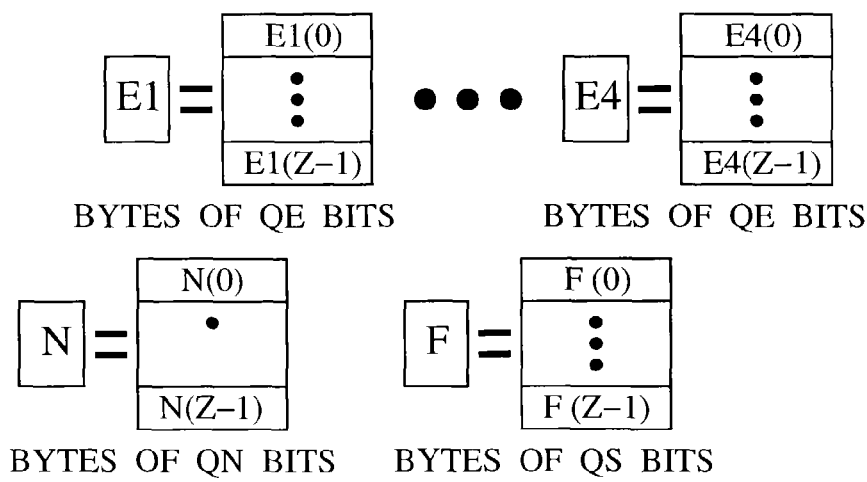

An overview of the invention's method of decoding a PCCC is shown in the block diagram in FIG. 2A for a four-parallel example of a PCCC (4-PCCC) using the extended-serial mode of decoding. Black dots at intersections of lines indicate connections, otherwise crossing lines are not connected. In FIG. 2A, the CODE VALUES are the received codeword symbol values for the 4-PCCC that are corrupted by noise. The DECODED INFORMATION BITS at the bottom of the FIG. are the decoded binary estimates for the frame of Z information bits of the 4-PCCC. The squares labeled by E1, E2, E3, E4, A, P1, P2, P3, and P4 indicate vector-parameters of different parameter types. (Each and every parameter within a vector-parameter is considered to consist of a binary byte of data.) The blocks labeled IQS, RTLD1, RTLD2, RTLD3, RTLD4, and MSB are functions. The basic function of the block IQS is to initialize, quantize, and store the real-valued CODE VALUES into binary data bytes. The blocks labeled RTLD1, RTLD2, RTLD3, and RTLD4 perform the invention's recursive table-lookup decoding algorithm on the first, second, third, and fourth constituent subcodes of the 4-PCCC, respectively. (The algorithm is actually a method for decoding a convolutional code, however it will be refered to as an algorithm to prevent confusion with the invention's method of decoding a PCCC.) The block labeled MSB performs the function of taking the most significant bit from each byte in a vector-parameter to create a frame of Z binary bits. The lines in the block diagram in FIG. 2A represent connecting (reading or storing) of vector-parameters. The arrows indicate the progression for updating the binary data bytes stored at the vector-parameter. The arrow into a vector-parameter square indicates that the data bytes stored at the vector-parameter have been updated from a function block. The line leaving a vector-parameter square indicates that the updated data bytes are to be used in a function block. The flow of progression is in general from top to bottom in FIG. 2A. The structure of the block diagram in FIG. 2A is repetative for each section containing blocks RTLD1, RTLD2, RTLD3, and RTLD4. Only the first and last repetative sections are shown. Each repetative section will be refered to as an iteration within the method of decoding a PCCC. The pair of three vertical dots represents the repeating structure of the iterative sections not included in the block diagram.

Figure 2C:
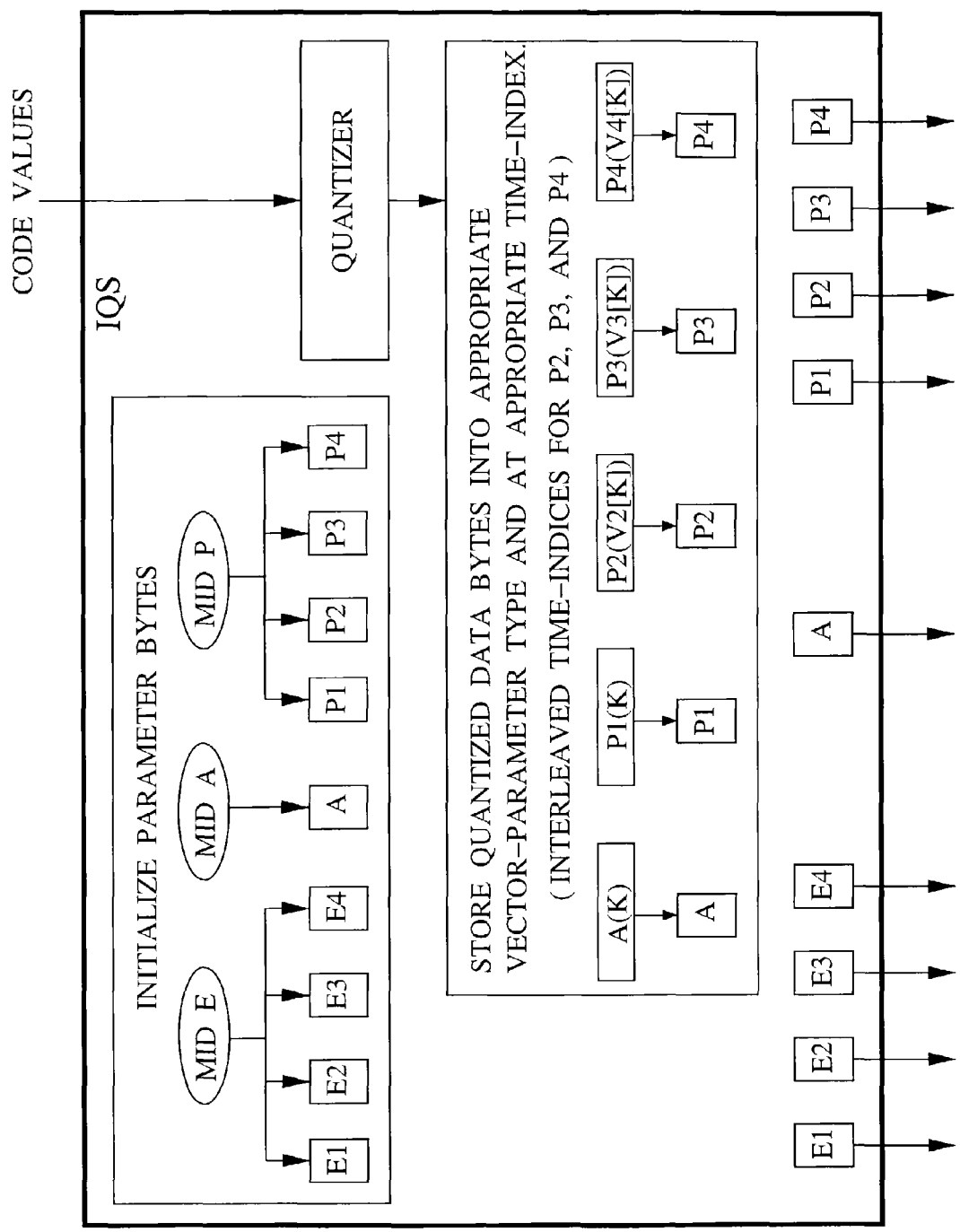
FIG. 2C is a diagram showing the details of block IQS of the invention's method of decoding for a 4-PCCC in FIG. 2A.

In the block diagram of the invention's method of decoding for a 4-PCCC in FIG. 2A, the CODE VALUES are sent to block IQS. The function of block IQS is shown in FIG. 2C. Each CODE VALUE is quantized by the QUANTIZER into a binary byte of Q bits (refered to as a binary Q-byte) and then stored into an appropriate vector-parameter type and at the appropriate time-index with respect to the base-codeword for a 4-PCCC. The QUANTIZER of block IQS consists of a quantization function and a labeling function which assigns binary Q-bytes such that the most significant bit corresponds to the sign of the CODE VALUE. In block IQS, the Q-bytes from the QUANTIZER that correspond to quantized information symbols of the base-codeward are to be stored into the vector-parameter A, while the Q-bytes that correspond to quantized parity symbols are to be stored into P1, P2, P3, or P4 respectively. The different vector-parameter types of A and P1, P2, P3, P4 may contain binary bytes consisting of more (or less) than Q bits. The conversion of the binary Q-bytes created by the QUANTIZER into binary bytes consisting of QA bits for the information symbols in vector-parameter A, or into QP-bytes for the parity symbols in vector-parameters P1, P2, P3, P4, is typically accomplished by appending binary zero bits to the quantized Q-bytes. (The conversion is based on the inherent quantization and labeling functions that are assigned to these parameters and is described in further detail in the part of this description on quantization and labeling functions for the QUANTIZER of block IQS.) In FIG. 2C of block IQS, parameters at time-indices that correspond to missing punctured symbols are initialized (stored) with specific binary bytes. At the time-indices of vector-parameter A that were punctured, the parameters are initialized with a specific QA-byte refered to as MID A, while at the punctured time-indices of vector-parameters P1, P2, P3, and P4, the parameters are initialized with a specific binary QP-byte refered to as MID P. Also shown in FIG. 2C for block IQS, is an additional set of four vector-parameters E1, E2, E3, and E4 that are initialized at all Z time-indices with a specific binary byte consisting of QE bits, refered to as MID E. The completion of the function of block IQS is indicated at the bottom of FIG. 2C for block IQS by lines connected to the vector-parameters and leaving block IQS. These lines correspond to the lines in the overview of the method of decoding in FIG. 2A at the point of leaving block IQS. (Note that a more general version of block IQS may include more than one quantizer for quantizing the different parameter types.)

Returning to the point of leaving block IQS in FIG. 2A, all the time-indices of the vector-parameters have been either stored with bytes from the quantizer (at the appropriate time-indices) or stored with initialization bytes. Thus, the vector-parameters A, and P1, P2, P3, P4, and E1, E2, E3, E4 are stored with the appropriate QA-bytes, QP-bytes, or QE-bytes respectively. Now in FIG. 2A, block RTLD1 takes vector-parameters A, P1, and E1 that correspond to the first constituent subcode of the 4-PCCC and performs the invention's recursive table-lookup decoding algorithm for the first constituent subcode with respect to its sequential (non-interleaved) time-index ordering. The recursive table-lookup decoding algorithm is one of the key components of this invention and will be described later in further detail for the block RTLD1. Upon completion of the algorithm of block RTLD1 in FIG. 2A, the binary bytes stored at the vector-parameter A have been updated. Hence, parameters A(0) through A(Z−1) have been updated. In addition, the binary bytes stored at vector-parameter E1 have also been updated.

After block RTLD1 has performed the recursive table-lookup decoding algorithm with respect to the first constituent subcode in FIG. 2A, then block RTLD2 takes the updated parameters stored in A, along with the vector-parameters in P2 and E2, and performs the recursive table-lookup decoding algorithm with respect to the second constituent subcode while using its interleaved time-index ordering V2[K] for K=0 to K=Z−1. The details of block RTLD2 are described later, but are similar to the details for block RTLD1. The interleaved time-index ordering used in RTLD2 is the same interleaved time-index ordering that was used for encoding the second constituent subcode. After block RTLD2 completes the recursive algorithm, the binary bytes stored in vector-parameter A have been updated. In addition, the binary bytes stored in the vector-parameter E2 have also been updated. Now in FIG. 2A, block RTLD3 uses the updated vector-parameter A along with the vector-parameters E3 and P3 to perform the recursive table-lookup decoding algorithm for the third constituent subcode with respect to its interleaved time-index ordering V3[K] for K=0 to K=Z−1. When block RTLD3 completes the algorithm, then the vector-parameter A has been updated along with the vector-parameter E3. Block RTLD4 now uses the updated vector-parameter A along with E4 and P4 and performs the recursive table-lookup algorithm for the fourth constituent subcode with respect to its interleaved time-index ordering V3[K], and updates the vector-parameters A and E4. The details of blocks RTLD3 and RTLD4 are described later, but are similar to the details for block RTLD1.

At the point of leaving RTLD4 for the first time in FIG. 2A, the recursive table-lookup decoding algorithm has been performed once for each of the four constituent subcodes of the four-parallel PCCC. This will be regarded as completing the first iteration of decoding for all four constituent subcodes. Further iterations of the decoding method are performed in the same way as the first iteration. Each iteration consists of: block RTLD1 using the updated vector-parameters A and E1 along with the original vector-parameter P1 to create more newly updated vector-parameters A and E1; then block RTLD2 using the updated vector-parameters A and E2 along with the original vector-parameter P2 to create more newly updated vector-parameters A and E2; then block RTLD3 using the updated vector-parameters A and E3 along with the original vector-parameter P3 to create more newly updated vector-parameters A and E3; then finally block RTLD4 using the updated vector-parameters A and E4 along with the original vector-parameter P4 to create more newly updated vector-parameters A and E4. The repeating structure of the second iteration through the L-1 iteration is indicated by the pair of three vertical dots in FIG. 2A. The vector-parameters E1, E2, E3, and E4 will have been updated during each iteration. The vector-parameter A is updated after each constituent subcode is decoded with blocks RTLD1, RTLD2, RTLD3, RTLD4 within an iteration. Therefore, each iteration further updates the vector-parameter A, as well as the vector-parameters E1, E2, E3, and E4. Finally, the last iteration of the four blocks RTLD1, RTLD2, RTLD3, and RTLD4 is performed as shown in FIG. 2A. The parameters A(0) through A(Z−1) of the vector-parameter A contain binary bytes of QA-bits that represent an approximation to an estimate for each of the Z information bits of the PCCC base-codeword. The block MSB takes the most significant bit of each byte stored at parameters A(0) through A(Z−1) and results in Z binary bits that are the DECODED INFORMATION BITS for the PCCC codeword. (The inherent quantization function and labeling function assigned to the parameter A(K) is related to the quantization and labeling function of the QUANTIZER in block IQS and has the most significant bit of each possible QA-byte being a hard-decision estimate for the sign of an information bit of the base-codeword of a PCCC.)

The method of decoding shown for the invention in FIG. 2A is for the example of a four-parallel PCCC. It is a straight-forward extrapolation to obtain this invention's method of decoding for a different number of parallel subcodes such as a three-parallel PCCC or a five-parallel PCCC. A three-parallel PCCC does not include a fourth constituent subcode so the method of decoding does not include block RTLD4 nor the vector-parameters E4 and P4. Thus, the first iteration is finished after block RTLD3. A five-parallel PCCC includes a fifth constituent subcode so a block RTLD5 is included in the decoding method after block RTLD4 within each iteration of FIG. 2A. The decoding method for a five-parallel PCCC also includes the additional vector-parameters P5 and E5. Block RTLD5 would be analogous to block RTLD4 except that the appropriate interleaved time-index ordering V5[K] would be utilized with the appropriately pre-stored lookup-tables corresponding to the fifth constituent encoder.

Typically, the frame of Z information bits encoded by a PCCC generally contains Z-T actual input bits appended with T bits that are included to force one or more of the constituent encoders to a known state. In this case, the knowledge of the final state of a constituent encoder is incorporated into the recursive table-lookup decoding algorithm as is described for block RTLD1.

Description of Block RTLD1
(The Recursive Table-Lookup Decoding Algorithm for Subcode 1.)

Figure 2D:
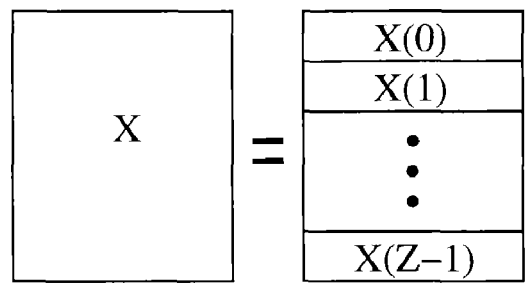
FIG. 2D shows notation for representing the interleaved time-index orderings for block IQS in FIG. 2C and also for the method of decoding and for the invention's recursive table-lookup decoding algorithm in FIG. 2E.
Figure 2D:
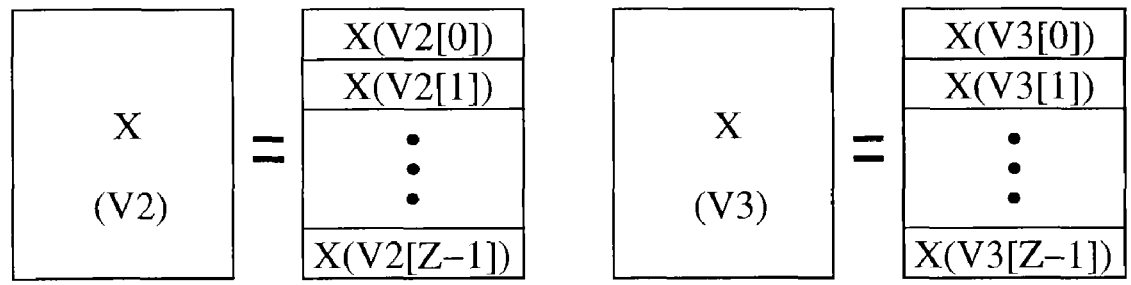
Figure 2D:
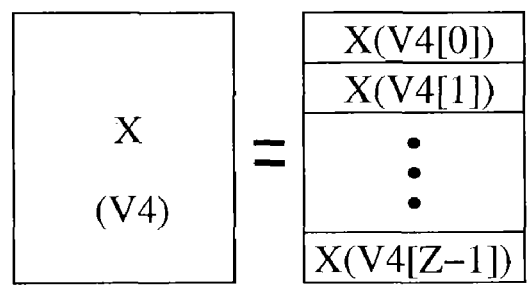
Figure 2E:
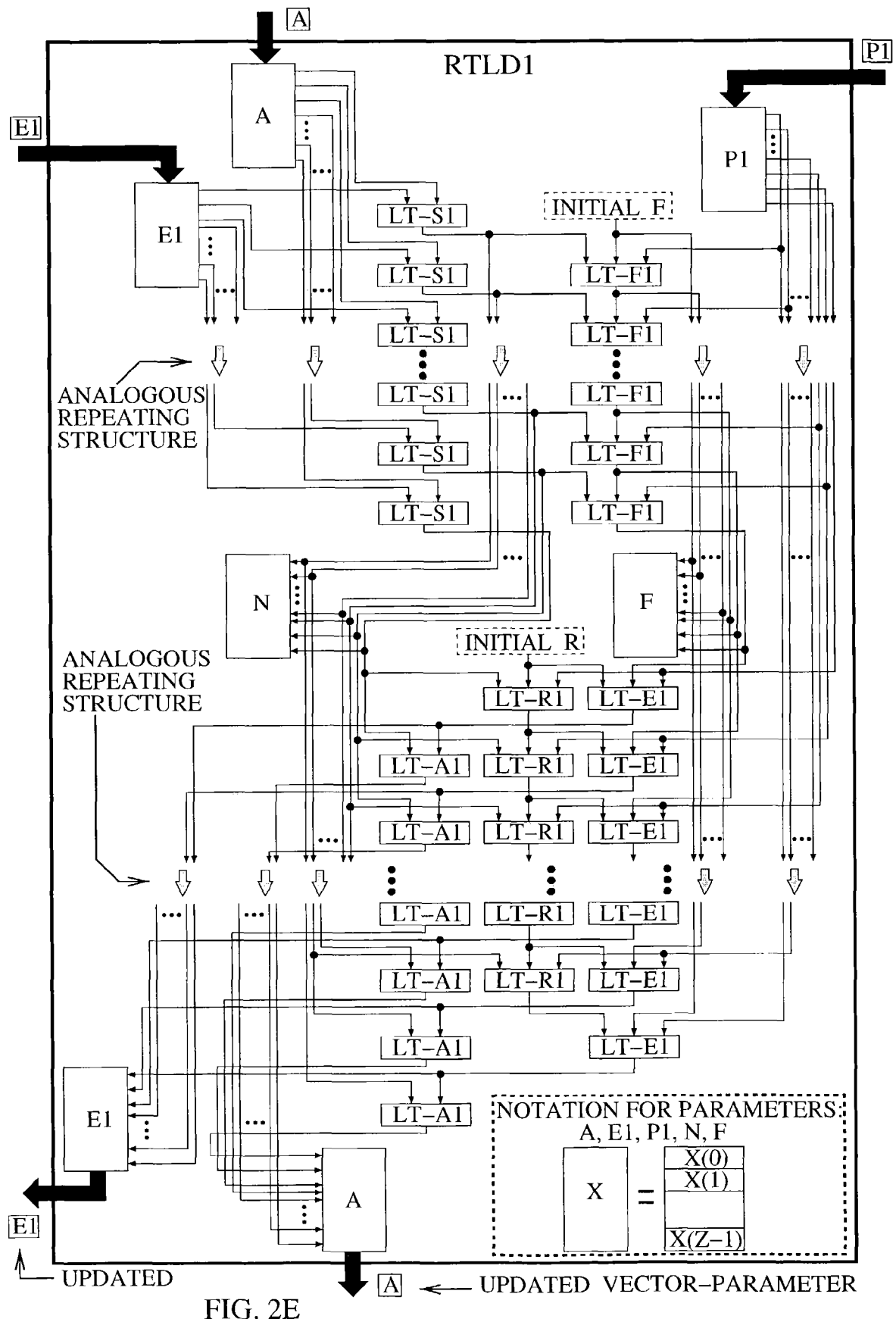
FIG. 2E is a diagram showing the details of block RTLD1 of the invention's method of decoding a PCCC in FIG. 2A, which is the invention's recursive table-lookup decoding algorithm for approximate decoding of a convolutional code.
Figure 2F:
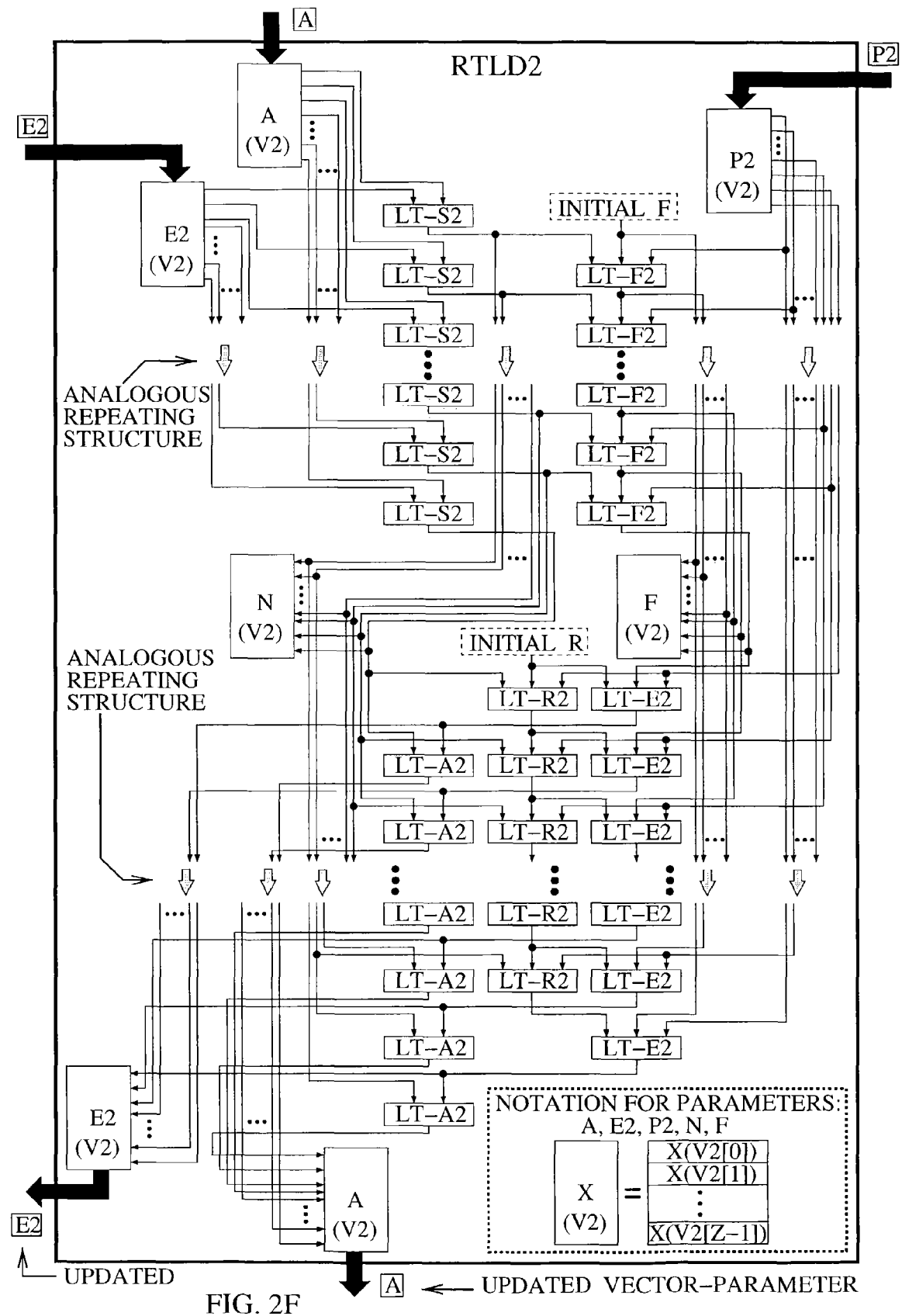
FIG. 2F is a diagram showing the details of block RTLD2 of the invention's method of decoding a 4-PCCC in FIG. 2A.
Figure 2G:
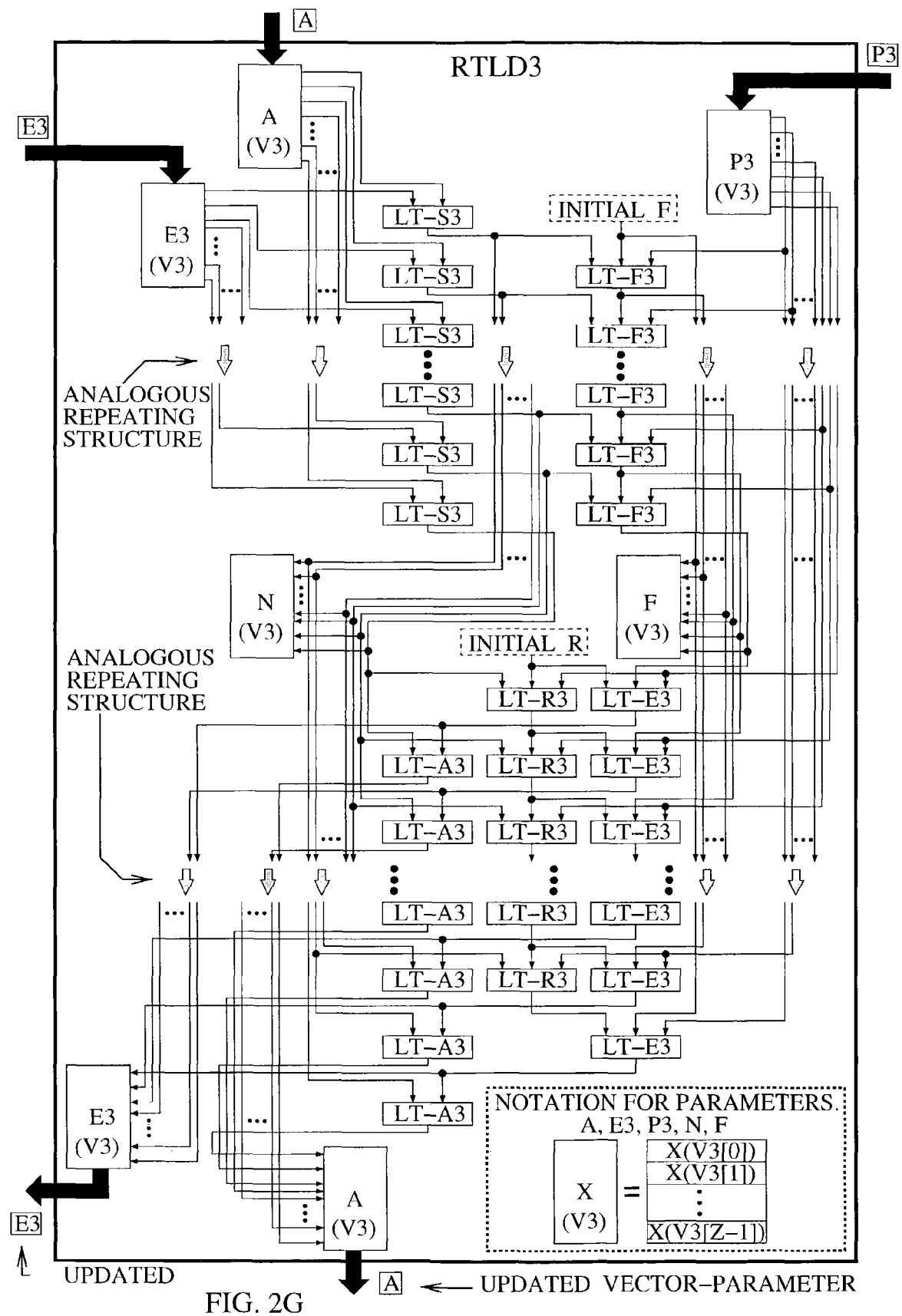
FIG. 2G is a diagram showing the details of block RTLD3 of the invention's method of decoding a 4-PCCC in FIG. 2A.
Figure 2H:
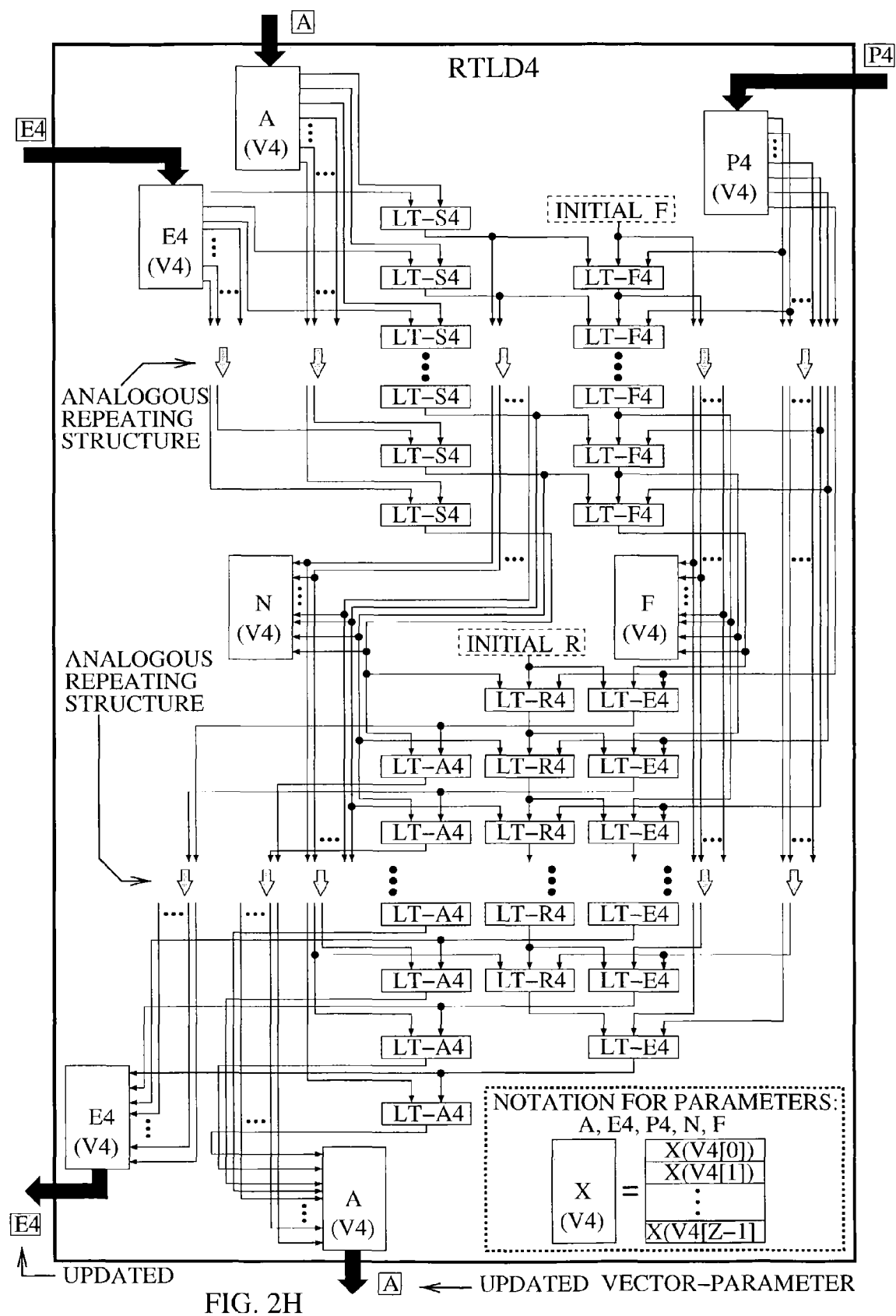
FIG. 2H is a diagram showing the details of block RTLD4 of the invention's method of decoding a 4-PCCC in FIG. 2A.
Figure 2I:
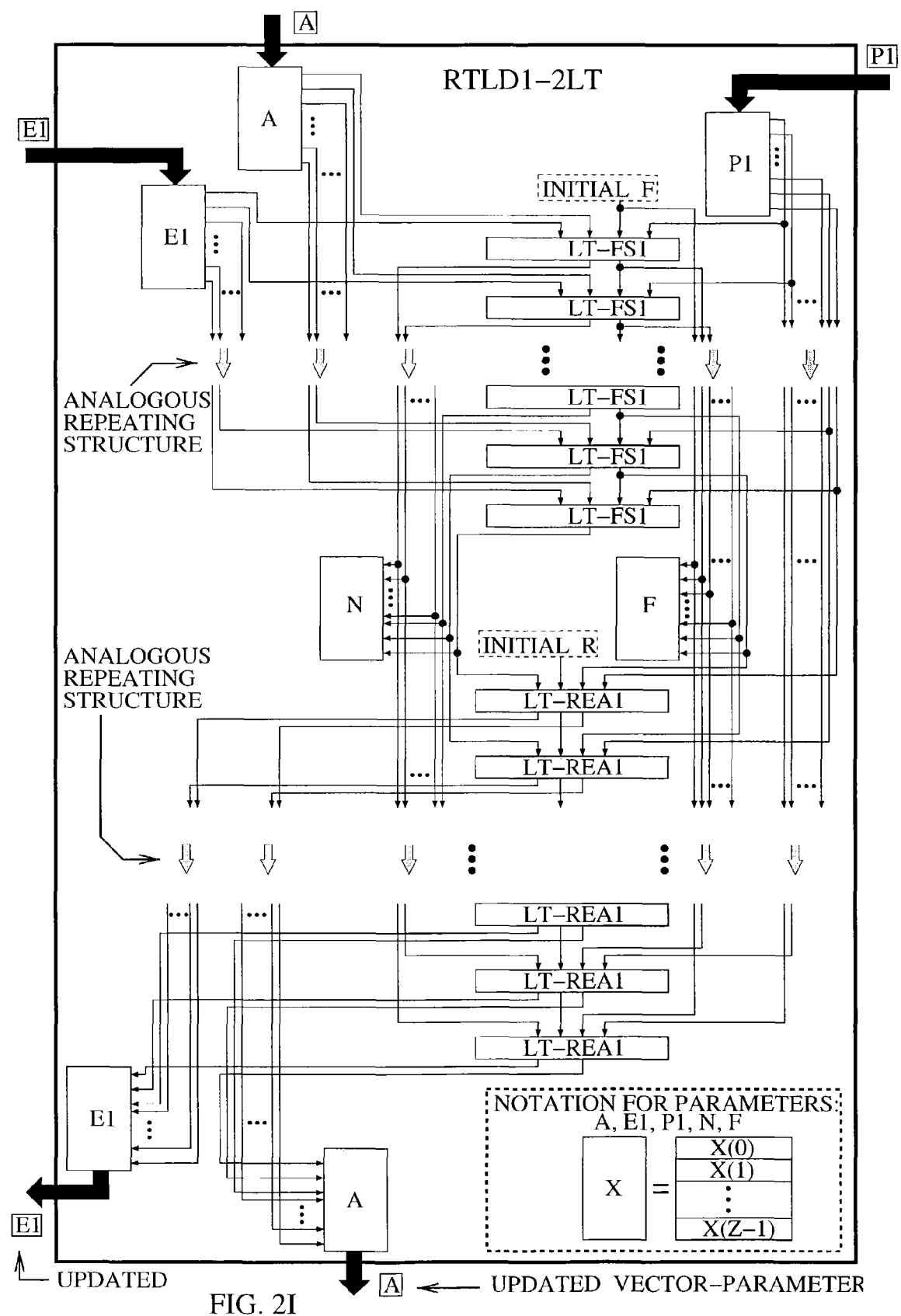
FIG. 2I is a diagram showing the details of block RTLD1-2LT, an alternative version of implementing block RTLD1 in FIG. 2E, as the invention's recursive table-lookup decoding algorithm using a set of only two seperate lookup-tables.

A diagram showing the details of block RTLD1 is shown in FIG. 2E. This diagram describes the invention's recursive table-lookup decoding algorithm for the first constituent subcode. This version of the invention's constituent recursive table-lookup decoding algorithm shown in FIG. 2E utilizes five seperate lookup-tables. (A version that uses only two seperate, but in general larger, lookup-tables is shown in FIG. 2I and will be described later.) By convention, the first constituent subcode of a PCCC does not interleave the frame of Z information bits before the parity bits in vector P1 are generated by the constituent encoder (hence, trivial interleaver). Therefore, the decoding of the first constituent subcode utilizes the sequential ordering of time-indices (i.e., K=0 to K=Z−1).

For block RTLD1 in FIG. 2E, the larger sub-blocks labeled by A, P1, E1, N, and F represent vector-parameters with Z time-indexed parameters each consisting of a binary byte of data. The number of bits in the binary byte depends on the type of parameter and are QA bits for A, QP bits for P1, QE bits for E1, QN bits for N, and QS bits for F. The large arrowed-lines entering the top of the parameter sub-blocks A, P1, and E1 refer to the input connections of the entire vector-parameter into the block RTLD1 as shown in the overview of FIG. 2A. The large arrowed-lines leaving the bottom of the parameter sub-blocks A and E1 refer to the output connections of the entire vector-parameters out of the block RTLD1 as shown in the overview of FIG. 2A. The notation for these vector-parameter sub-blocks is shown in FIG. 2D where the label X is used to represent either of the vector-parameters A, P1, E1, N, or F. The top portion of each parameter sub-block X represents the time-indexed parameter byte, X(0), and increases sequentially down the sub-block until the last parameter byte X(Z−1) at the bottom of the sub-block. In FIG. 2E, each of the small lines connected to the side of a vector-parameter's sub-block X represents a binary byte stored at the time-indexed parameter X(K). The top-most line connected to the side of a parameter's sub-block represents the binary byte at X(0), the second topmost line refers to X(1), and this notation continues sequentially to the lowest line connected to the side of the sub-block which represents the binary byte at X(Z−1). Black dots at an intersection of lines indicates a connection where the particular parameter byte goes to more than one place, otherwise crossing lines are not connected together.

For block RTLD1 in FIG. 2E, the sub-blocks labeled LT-S1, LT-F1, LT-R1, LT-E1, and LT-A1 indicate five seperate lookup tables. These five lookup-tables are considered to be seperate in the sense that the tables can be different sizes and each pre-stored with different sized binary bytes, so the binary address words for the entries of each lookup-table will range from the binary all-zeroes address word up to the all-ones address word. The set of small lines with arrows entering the top of a lookup-table sub-block indicates the binary address word of the entry of the lookup-table that is to be read out. Moreover, the binary address word is created by concatenating together the seperate binary bytes that correspond to each line entering the top of the sub-block. The binary data byte that is to be read out of a lookup-table is represented by the line emerging out of the bottom of the lookup-table sub-block. The output line from a lookup-table sub-block is not considered valid until all the input address lines are valid at the sub-block. This controls the progression of the algorithm of block RTLD1 in FIG. 2E. The flow of the progression is, in general, from top to bottom. The algorithm of RTLD1 can be considered to have two sections, a forward (top) section and a reverse (bottom) section. The forward section utilizes the lookup-tables LT-S1 and LT-F1, while the reverse section utilizes the lookup-tables LT-R1, LT-E1, and LT-A1. Each section has a structure that is analogously repeating for the entire Z length of the vector-parameters, so vertical dots in FIG. 2E indicate the missing portion of the analogously repeating structure. Only the beginning and ending of the structure is shown. The gray arrows at the missing portions of structure indicate that the parameter lines also continue in the missing analogously repeating structure, but they may be reducing in number or increasing in number. Between the forward section and the reverse section in FIG. 2E, two temporary internal vector-parameters labeled N and F store the binary bytes being read out from the lookup-tables LT-S1 and LT-F1, respectively. Thus, to facilitate the description of the algorithm, the binary bytes read out of the lookup-tables LT-S1 and LT-F1 will be refered to as N(K) and F(K), respectively. Similarly, the binary bytes that are read out from the lookup-tables LT-E1 and LT-A1 are refered to as E1(K) and A(K) because they are stored into the vector-parameters of E1 and A, respectively.

The forward (top) section of the algorithm of block RTLD1 in FIG. 2E is a recursive process of reading from lookup-tables. The pre-set binary byte value of INITIAL F is a QS-byte that is stored at the parameter F(0). (The pre-set byte value of INITIAL F is typically the all-zeroes byte.) The recursive process starts by forming the binary address word for the lookup-table LT-S1 by concatenating together the binary bytes at E1(0) and A(0), and then reading out a binary byte that is to be stored at N(0) and hence is refered to as N(0). Additionally, this byte N(0) is concatenated together with the bytes at F(0) and at P1(0) to create the binary address word for reading from the lookup-table LT-F1 which produces a byte that is to be stored at F(1) and hence is refered to as F(1). The recursive process continues in a sequentially increasing time-index ordering from K=0 to K=Z−2. The recursive process consists of creating the binary address word for the lookup-table LT-S1 by concatenating the binary bytes E1(K) and A(K) together, and then reading out the binary byte N(K). Additionally, this byte N(K) is concatenated with the bytes F(K) and P1(K) to create the binary address word for reading from the lookup-table LT-F1 which produces the byte F(K+1). At the end of the recursive process the binary address word for the lookup-table LT-S1 is formed by concatenating the binary bytes E1(Z−1) and A(Z−1) together to read out the binary byte N(Z−1). The sets of three vertical dots and the grey arrows in FIG. 2E indicate the structure that is missing from the diagram. However, the missing structure is analogous to the structure shown, so it can be infered from the diagram. The gray arrows at the missing portion of structure indicates that the parameter lines also continue in the analogously repeating structure, but they may be reducing in number because the parameters are only used in the missing portion or they may be increasing in number because new temporary paramters are being read from lookup-tables in the missing portion. Therefore, the forward (top) section of the algorithm is recursively reading from two seperate lookup-tables and storing into temporary vector-parameters the bytes being read with respect to a forward sequentially increasing time-index ordering from K=0 to K=Z−1.

The reverse (bottom) section of the algorithm of block RTLD1 in FIG. 2E also performs a recursive process of reading from lookup-tables, but with respect to a sequentially decreasing time-index ordering. The pre-set binary byte value of INITIAL R is a QS-byte which depends on the termination property of a PCCC with respect to the first constituent subcode. (Typically, the binary byte value of INITIAL R is either the all-zeroes byte indicating a terminated encoder trellis or an assigned byte value representing equally likely trellis states.) The binary bytes that are read out from the lookup-table LT-R1 consist of QS bit bytes (similar to parameters F(K)) and are not required to be stored into a temporary vector-parameter. (The binary QS-byte read out of the lookup-table LT-R1 can be considered to be stored at a parameter defined as R, so the parameter R would contain the most recent QS-byte read from the lookup-table LT-R1.) The recursive process consists of forming the binary address words for the lookup-tables LT-E1 and LT-R1. The data byte read out of lookup-table LT-E1 is used as part of the binary address word for lookup-table LT-A1 and also stored (updated) at the vector-parameter E1. The data byte read out of lookup-table LT-A1 is stored (updated) at the vector-parameter A. The data byte read out of lookup-table LT-R1 is used in the next recursion as part of the address words for lookup-tables LT-E1 and LT-R1. The recursive process starts by forming the binary address word for the lookup-table LT-E1 by concatenating the binary bytes INITIAL R, F(Z−1), and P1(Z−1) together to read out a binary byte that is to be stored (updated) at parmeter E1(Z−1) and hence is refered to as E1(Z−1). Additionally, the binary address word for the lookup-table LT-R1 is formed by concatenating the binary bytes N(Z−1), INITIAL R, and P1(Z−1) together to read out a binary byte which will be used in parts of the address words for the next recursive access of the lookup-tables LT-R1 and LT-E1. The process also includes forming the binary address word for the lookup-table LT-A1 created by concatenating the binary bytes N(Z−1) and E1(Z−1) together to read out the binary byte A1(Z−1). The data bytes E1(Z−1) and A(Z−1) read out from the lookup-tables are updates that are stored in the vector-parameters E1 and A. The reverse recursive process continues in a sequentially decreasing time-index ordering from K=Z−1 to K=1. The sets of three vertical dots and the grey arrows in FIG. 2E indicate the structure that is missing from the diagram. However, the missing structure is analogous to the structure shown, so it can be infered from the diagram. Therefore, the reverse (bottom) section of the algorithm is recursively reading from three seperate lookup-tables with respect to a sequentially decreasing time-index ordering from K=Z−1 to K=1. Finally at time-index K=0, lookup-table LT-R1 is not required to be read so only the lookup-tables LT-E1 and LT-A1 are accessed. The binary address word for the final lookup-table sub-block LT-E1 is formed by concatenating the binary byte most recently read out from lookup-table LT-R1 together with the binary bytes F(0) and P1(0) so to read out the binary byte E1(0). Then the binary address word for the last lookup-table sub-block LT-A1 is formed by concatenating the binary bytes N(0) and E1(0) together to read out the binary byte A1(0).

When the recursive table-lookup decoding algorithm for the first constituent subcode in block RTLD1 finishes, there are updated binary bytes stored in the vector-parameter A, and also in the vector-parameter E1. The updated vector-parameter A will next be used in the block RTLD2 of the decoding method in FIG. 2A, while the updated vector-parameter E1 will be used in the next iteration of the decoding method in FIG. 2A when block RTLD1 is used again.

Description of Block RTLD2

(The Recursive Table-Lookup Decoding Algorithm for Subcode 2.)

Block RTLD2 of the decoding method in FIG. 2A is analogous to the block RTLD1 in the sense that block RTLD2 performs the invention's recursive table-lookup decoding algorithm as described for block RTLD1, but in block RTLD2 it is performed with respect to the second constituent subcode of a PCCC instead of the first constituent subcode. The structure of block RTLD2 is the same as the structure of block RTLD1. The details of block RTLD2 are shown in FIG. 2F. A difference between block RTLD2 and block RTLD1 is that block RTLD2 uses the vector-parameters P2 and E2 corresponding to the second constituent subcode, instead of P1 and E1 corresponding to the first constituent subcode. Another difference is that the convolutional encoder for the second constituent subcode of the PCCC may be different than the first convolutional encoder, so the set of lookup-tables in block RTLD2 which are labeled as LT-S2, LT-F2, LT-R2, LT-E2, and LT-A2 may be pre-stored with binary data bytes that are different than the binary bytes pre-stored in the five lookup-tables in block RTLD1. The second constituent subcode of a PCCC is encoded with the information bits interleaved into the time-index ordering of V2[K] for K=0 to K=Z−1, so block RTLD2 utilizes this interleaved time-index ordering V2[K] for the vector-parameters A, E2, P2, N, and F in the algorithm. The notation of (V2) for the vector-parameters in FIG. 2F represents that the interleaved ordering of data bytes is used as shown in FIG. 2D. Letting the label X represent the vector-parameters A, E2, P2, N, and F, the top-most byte of a vector-parameter block X with sub-label (V2) is the interleaved byte X(V2[0]). The second top-most byte is the interleaved byte X(V2[1]). The interleaved ordering continues until the bottom-most byte of X(V2[Z'11]). Therefore in FIG. 2F of block RTLD2, the parameter lines connected to the side of a vector-parameter sub-block represent the interleaved ordering of the parameter bytes stored at the vector-parameter. Thus, the top-most parameter line connected to the side of the vector-parameter A sub-block represents the interleaved parameter A(V2[0]), the second top-most line represents the interleaved parameter A(V2[1]), down to the bottom-most line connected to the side of the vector-parameter A sub-block representing the interleaved parameter A(V2[Z−1]). In the forward (top) recursive section of the algorithm in block RTLD2, the process is progressing through the interleaved time-index ordering. In the reverse (bottom) recursive section of the algorithm in block RTLD2, the process is progressing through the reverse of the interleaved time-index ordering. When the recursive table-lookup decoding algorithm for the second constituent subcode in block RTLD2 finishes, there are updated binary bytes stored in the vector-parameter A, and also in the vector-parameter E2.

Description of Block RTLD3

(The Recursive Table-Lookup Decoding Algorithm for Subcode 3.)

Block RTLD3 of the decoding method in FIG. 2A is analogous to block RTLD1 in the sense that block RTLD3 performs the invention's recursive table-lookup decoding algorithm as described for block RTLD1, but in block RTLD3 it is performed with respect to the third constituent subcode instead of the first constituent subcode of a PCCC. The structure of block RTLD3 is the same as the structure of block RTLD1. The differences between block RTLD3 and block RTLD1 are analogous to the differences described for block RTLD2. The details of block RTLD3 are shown in FIG. 2G. The set of five lookup-tables in RTLD3 are labeled as LT-S3, LT-F3, LT-R3, LT-E3, and LT-A3. The vector-parameters used in block RTLD3 are A, E3, P3, N, and F. The interleaved time-index ordering, V3[K] for K=0 to K=Z−1, is used in block RTLD3 and the notation is shown in FIG. 2D. When the recursive table-lookup decoding algorithm for the third constituent subcode in block RTLD3 finishes, there are updated binary bytes stored in the vector-parameter A, and also in the vector-parameter E3.

Description of Block RTLD4

(The Recursive Table-Lookup Decoding Algorithm for Subcode 4.)

Block RTLD4 of the decoding method in FIG. 2A is analogous to block RTLD1 in the sense that block RTLD4 performs the invention's recursive table-lookup decoding algorithm as described for block RTLD1, but in block RTLD4 it is performed with respect to the fourth constituent subcode instead of the first constituent subcode of a PCCC. The structure of block RTLD4 is the same as the structure of block RTLD1. The differences between block RTLD4 and block RTLD1 are analogous to the differences described for block RTLD2. The details of block RTLD4 are shown in FIG. 2H. The set of five lookup-tables in RTLD4 are labeled as LT-S4, LT-F4, LT-R4, LT-E4, and LT-A4. The vector-parameters used in block RTLD4 are A, E4, P4, N, and F. The interleaved time-index ordering, V4[K] for K=0 to K=Z−1, is used in block RTLD4 and the notation is shown in FIG. 2D. When the recursive table-lookup decoding algorithm for the fourth constituent subcode in block RTLD4 finishes, there are updated binary bytes stored in the vector-parameter A, and also in the vector-parameter E4.

Pre-Storing of the Set of Lookup-Tables in RTLD1

The performance of the recursive table-lookup decoding algorithm of block RTLD1 is directly determined by the particular binary bytes that are pre-stored at each entry of the lookup-tables. In general, any method can be used to assign the binary bytes that are to be pre-stored into the lookup-tables. However, the best method for the invention is to pre-store each lookup-table with binary bytes that are determined by an inherent mathematical function. The lookup-tables in the recursive algorithm of block RTLD1 in FIG. 2E will be refered to as functional lookup-tables. Each functional lookup-table is assigned an inherent function of several input parameters. The function can be nonlinear and can even include logical conditions on the input parameters.

Each entry of a functional lookup-table corresponds to a different possible combination of quantized values for the input parameters of the function. The specific quantized values for the input parameters at each entry of a functional lookup-table is based on the binary address word of that entry. The binary address words for lookup-tables of block RTLD1 are composed of seperate binary bytes appended together. Each binary byte within the address word is a seperate parameter byte. All the parameter types in the algorithm of block RTLD1 are assigned inherent quantization functions with labeling functions. (Moreover, all the parameter types in the method of decoding are assigned inherent quantization functions with labeling functions.) The combination of quantization function and labeling function will be refered to as a mapping function. The inherent mapping function for a particular parameter type relates each possible binary byte value stored at the parameter with an inherent quantized real-value for the parameter. Therefore, the seperate bytes within the binary address word for an entry of a functional lookup-table correspond to seperate quantized values for each input parameter. A functional output value results from applying the inherent function assigned to a lookup-table to the inherent quantized values corresponding to the input parameter bytes of the address word. The functional output value needs to be quantized (if the function does not produce appropriately quantized values) and mapped to a binary byte. The output of a functional lookup-table is itself some type of parameter in the algorithm of block RTLD1 with an inherent mapping function (quantization and labeling) assigned to it. Thus, the inherent mapping function that corresponds to the type of parameter being read out from the lookup-table is used to map the functional output value onto a binary byte that is to be pre-stored into the functional lookup-table at the entry corresponding to the selected binary address word.

The recursive table-lookup decoding algorithm as shown in block RTLD1 in FIG. 2E can be selected to approximate many well-known decoding algorithms by appropriately pre-storing the functional lookup-tables LT-S1, LT-F1, LT-R1, LT-E1, and LT-A1. For example, the well-known BCJR decoding algorithm (L. R. Bahl, J. Cooke, F. Jelinik, and J. Raviv, "Optimal decoding of linear codes for minimizing symbol error rate", published in IEEE Trans. Inform. Theory, Vol.20, pp. 284–287, March 1974) can be approximated by appropriately pre-storing the functional lookup-tables in the recursive table-lookup decoding algorithm of block RTLD1. In this case, the lookup-table LT-S1 is approximating a function that subtracts the log-likelihood ratio (LLR) of the extrinsic estimate for an information bit from the LLR of the aposterior estimate for an information bit to produce the LLR estimate for an information bit. Thus, the lookup-table LT-S1 is assigned the function of subtracting LLR's. The data byte in the parameter A(K) corresponds to the LLR of the aposteriori estimate for the information bit at time-index K, while the data byte in the parameter E1(K) corresponds to the LLR of the extrinsic estimate for the information bit at time-index K, and the data byte in the paramter N(K) that is read from the lookup-table corresponds to the resulting LLR of the information bit. It should be noted that to obtain log-likelihood ratios, a signal-to-noise ratio (SNR) is required within the function that is assigned to a lookup-table. However, the SNR value is assumed to be a known constant and included within the function. The inherent mapping functions for parameters may also include the SNR constant. For the case of approximating the BCJR algorithm, the other lookup-tables are also assigned inherent functions. The lookup-table LT-F1 is assigned a function that computes the LLR(s) of the normalized forward-partial-metric(s) for the next trellis-section of the constituent encoder by using the LLR(s) of the normalized forward-partial-metric(s) for the current trellis-section along with the LLR estimate for an information bit and the LLR for a parity bit. The data byte in the parameter F(K) corresponds to the LLR(s) of the normalized forward-partial-metric(s) for the states of the trellis-section at time-index K. The data byte in the parameter P1(K) corresponds to the LLR for the parity bit at time-index K. The lookup-table LT-R1 is assigned a function that computes the LLR(s) of the normalized reverse-partial-metric(s) for the previous trellis-section of the constituent encoder by using the LLR(s) of the normalized reverse-partial-metric(s) for the current trellis-section along with the LLR estimate for an information bit and the LLR for a parity bit. The data byte stored in the lookup-table LT-R1 (which can be considered to be a parameter byte labeled as R) corresponds to the LLR(s) of the normalized reverse-partial-metric(s) for the states of the trellis-section at time-index K. The lookup-table LT-E1 is assigned a function that computes the LLR of the extrinsic estimate for an information bit based on the trellis-section of the constituent subcode along with both the forward and reverse partial-metric(s), and the LLR for a parity bit. Lastly, the lookup-table LT-A1 is assigned a function that computes the LLR of the aposteriori estimate for an information bit by adding the LLR of the extrinsic estimate for an information bit to the LLR of the estimate for an information bit to produce. This assignment of inherent functions for the functional lookup-tables in RTLD1, along with the appropriate assignment of inherent mapping functions to the parameters of RTLD1 will allow the recursive table-lookup decoding algorithm of RTLD1 to approximate the BCJR decoding algorithm. The performance of the approximation depends on the selection of the inherent quantization functions and labeling functions for the parameters types. (Note that the computations involved for the inherent functions are performed only for the pre-storing of the lookup-tables in block RTLD1 with appropriate binary data bytes. The recursive algorithm of block RTLD1 does not require any computations.)

Besides the BCJR algorithm, other algorithms such as a new modified version of the BCJR algorithm refered to as the MBCJR algorithm (P. C. Massey and Daniel J. Costello, Jr., "New Low-Complexity Turbo-Like Codes", published in Proc. IEEE Information Theory Workshop, Cairns, Australia, pp. 70–72, September 2001), can be approximated by the recursive table-lookup decoding algorithm in block RTLD1. The MBCJR algorithm improves the convergence of the decoding for several PCCC's, particularly the 2-state PCCC's. The functions assigned to the lookup-tables for approximating the MBCJR decoding algorithm are similar to those for the BCJR algorithm except that a sensitivity constant has been incorporated into the functions for the lookup-tables LT-F1 and LT-R1, or alternately the sensitivity constant can be incorporated into the function for the lookup-table LT-E1. Moreover, other modified forms of the BCJR algorithm can be approximated. The functions for the lookup-tables can include complex nonlinear functions that incorporate logical conditions on the parameters that can not be performed by the basic mathematical processors typically used in other methods of decoding.

Pre-Storing of the Lookup-Tables of RTLD2, RTLD3, and RTLD4

The blocks RTLD2, RTLD3, and RTLD4 are analogous to block RTLD1 in the sense that they perform the same recursive table-lookup decoding algorithm except that it is with respect to a different constituent subcode of a PCCC. Some of the functional lookup-tables are pre-stored with data bytes that are based on functions that depend on a constituent encoder's trellis-section structure. For the case of approximating the BCJR algorithm, the functions assigned to the lookup-tables LT-F1, LT-R1, and LT-E1 in block RTLD1 are dependent on the trellis-section structure of the encoder for the first constituent subcode of a PCCC. Thus, the lookup-tables LT-F2, LT-R2, and LT-E2 in block RTLD2 will be pre-stored with binary bytes related to the specific trellis-section structure for the encoder of the second constituent subcode of a PCCC. Similarly, the lookup-tables in blocks RTLD3 and RTLD4 will be pre-stored relative to the specific trellis-section structures for the encoders of the third and forth constituent subcodes. Conversely, the lookup-tables LT-S1 and LT-A1 in block RTLD1 are not necessarily dependent on the specific encoder for the first constituent subcode, so the lookup-tables LT-S2, LT-S3, and LT-S4 in blocks RTLD2, RTLD3, and RTLD4 may be identically pre-stored with data bytes as in the lookup-table LT-SI. Similarly, lookup-tables LT-A1, LT-A2, LT-A3, and LT-A4 may be identically pre-stored lookup-tables. If a constituent subcode utilizes an encoder that is identical to another constituent encoder, then the set of five lookup-tables for those subcodes may be identically pre-stored.

Quantization and Labeling Functions for the Quantizer of Block IQS

In block IQS, shown in FIG. 2C, the QUANTIZER quantizes the real-valued CODE VALUES with a quantization function and a labeling function to produce binary bytes of Q bits. A quantization value typically exists at the value of zero to account for the punctured code symbols. If it is assumed that the typical situation exists of binary phase-shift-keyed (BPSK) modulated code symbols corrupted by additive white gaussian noise (AWGN), then the log-likelihood ratio (LLR) for a CODE VALUE is linearly proportional to the real-value of a CODE VALUE. The signal-to-noise ratio (SNR) is assumed to be a known constant. Thus, a typical uniform quantization function on the CODE VALUES is also a uniform quantization function on the LLR's. The labeling function assigns the most significant bit of the binary bytes to indicate the sign of the LLR, which in turn indicates the hard-decision estimate of the quantization level. In block IQS, shown in FIG. 2C, the storing of the Q-bytes created by the QUANTIZER at the parameter A(K) or the paramters P1(K), P2(V2[K]), P3(V3[K]), and P4(V4[K]) may require conversion of the Q-byte in a QA-byte or a QP-byte. The inherent quantization function and labeling function assigned to these parameters will determine how the conversion is accomplished. However, typically the inherent quantization functions and labeling functions assigned to these parameters are directly related to the actual quantization function and labeling function of the QUANTIZER in block IQS. Typically, the number of bits QP equals the number of bits Q produced by the QUANTIZER. Thus, the parameters in P1, P2, P3, and P4 are assigned inherent quantization and labeling functions that are identical to the actual quantization and labeling functions of the QUANTIZER. Also typically, the number of bits QA is larger than Q and the inherent quantization function assigned to parameters in A is such that it just includes extra quantization levels in addition to the set of levels in the QUANTIZER. Thus, the inherent labeling function assigned to parameters in A is such that the QA-bytes labeling those quantization levels in common with levels of the QUANTIZER are just labeled with the same Q-bytes from the QUANTIZER with additional zero bits appended.

Inherent Quantization and Labeling Functions for Parameters

All the different types of parameters defined in the method of decoding have inherent quantization and labeling functions assigned to them. The inherent quantization function with an inherent labeling function shall be refered to an inherent mapping function. The selection of the inherent mapping functions for the parameters in the method of decoding is critical to the performance of the invention. The parameters P1(K), P2(K), P3(K), P4(K) typically share a common inherent mapping function that is typically related in not identical to the actual mapping function of the QUANTIZER in block IQS. The inherent mapping function for parameter A(K) is typically related to the actual mapping function of the QUANTIZER in block IQS. The parameters E1(K), E2(K), E3(K), E4(K) typically share a common inherent mapping function that is typically related to the inherent mapping function for A(K). The parameter N(K) typically uses the same inherent mapping function as A(K). The bytes read out from the lookup-table LT-R1 of block RTLD1 can be considered as a parameter byte labeled as R that has an inherent mapping function that is typically the same as the inherent mapping function for the parameter F(K). The inherent functions that are assigned to the functional lookup-tables in the invention's recursive table-lookup decoding algorithm of blocks RTLD1, RTLD2, RTLD3, and RTLD4 can be considered to incorporate the inherent mapping functions assigned to parameter types.

Version of the Recursive Table-Lookup Algorithm That Uses a Set of Only Two Seperate Five Lookup-Tables (Description of Block RTLD1-2LT)

The invention's recursive table-lookup decoding algorithm is a method of approximately decoding a convolutional code for the aposteriori estimates of the input bits. The algorithm shown in block RTLD1 in FIG. 2E used a set of five lookup-tables labeled LT-F1, LT-S1, LT-R1, LT-E1, and LT-A1. The algorithm can be implemented with different numbers of seperate lookup-tables. Some of the seperate lookup-tables can be combined to create as few as two seperate lookup-tables. When the lookup-tables are appropriately pre-stored, then the different versions will produce the exact same updated byte values in the vector-parameters A and E1. A diagram showing the details of a version of the invention's recursive table-lookup decoding algorithm using only two seperate lookup-tables is shown in FIG. 2I for a block called RTLD1-2LT. The block RTLD1-2LT can be directly substituted for the block RTLD1 in the invention's method of decoding a 4-PCCC shown in FIG. 2A. Analogous versions using only two seperate lookup-tables for the blocks RTLD2, RTLD3, and RTLD4 can be infered directly from the details of block RTLD1-2LT. The general structure of block RTLD1-2LT is similar to the structure seen for block RTLD1. The two lookup-tables labeled LT-F1 and LT-S1 from block RTLD1 are combined into a single lookup-table labeled LT-FS1 in block RTLD1-2LT in FIG. 2I. Similarly, the three lookup-tables LT-R1, LT-E1, and LT-A1 from block RTLD1 are combined into a single lookup-table labeled LT-REA1 in block RTLD1-2LT.

The lookup-table sub-blocks labeled as LT-FS1 in FIG. 2I have four parameter lines entering the top of the sub-block. The parameter bytes at the parameters E1(K), A(K), F(K), and P1(K) are concatenated together to create the binary address word for reading an entry of the lookup-table LT-FS1. Two parameter lines emerging out from the bottom of a sub-block LT-FS1 indicates that a binary data word that is pre-stored in lookup-table LT-FS1 is the concatenation of two binary parameter bytes. Thus, The data word that is read out from the lookup-table is split into two groups of binary bits, one group is the binary data byte for one parameter line leaving the sub-block, while the other group is the binary data byte for the other parameter line leaving the sub-block. The left-most parameter line leaving a sub-block LT-FS1 is refered to as N(K) and is identical to the parameter N(K) leaving sub-block LT-S1 in the original block RTLD1. The right-most parameter line leaving a sub-block LT-FS1 is connected to the next sub-block LT-FS1 so it is part of the concatenated address word for the next recursion. It is refered to as F(K+1) and is identical to the parameter F(K+1) leaving sub-block LT-F1 in the original block RTLD1.

The lookup-table sub-blocks labeled LT-REA1 in block RTLD1-2LT in FIG. 2I have four parameter lines entering the top of the sub-block that are concatenated together to form the binary address word for accessing an entry of the lookup-table. The three parameter lines leaving the bottom of a lookup-table sub-block LT-REA1 indicates that binary data words pre-stored in the table consist of three seperate binary parameter bytes that have concatenated together. Thus, the binary data word that is read out of the lookup-table is split into three groups of binary bits which are the three binary parameter bytes corresponding to the three lines leaving the sub-block. The left-most parameter line leaving sub-blocks LT-REA1 is refered to as the updated parameter byte E1(K). The right-most parameter line leaving is refered to as the updated parameter byte A(K). The middle parameter line leaving a sub-block LT-REA1 is recursively connected to the next sub-block LT-REA1 and so is part of the concatenated address word for the next recursion. The remaining description of the version of block RTLD1-2LR that uses only two seperate lookup-tables is the same as the description for block RTLD1 that uses five seperate lookup-tables. Other versions of the invention's recursive lookup-table decoding algorithm can be created by combining or seperating lookup-tables in an analogous manner. In the same way that the descriptions for blocks RTLD2, RTLD3, and RTLD4 differed from the description of block RTLD1 when each utilized five seperate lookup-tables, the versions of blocks RTLD2, RTLD3, and RTLD4 that utilize only two seperate lookup-tables are similarly different from the version of block RTLD1-2LT that utilizes only two seperate lookup-tables.

Alternative Embodiments of the Invention

In the foregoing specification, the invention has been described with reference to specific embodiments. However, one of ordinary skill in the art appreciates that various modifications and changes can be made without departing from the scope of the present invention as set forth in the claims.

I claim:

1. A method of decoding for parallel-concatenated convolutional codes that consist of at least two binary convolutional constituent subcodes of finite blocklength value and share a block of information-bits with respect to corresponding interleaver-orderings, so as to produce a block of said blocklength value decoded binary bits for the information-bits that are an approximation to decoded bits obtained from an iterative maximum a posteriori decoder when initially given code-bit channel-symbol values or quantized digital data representing channel-symbol values, wherein the decoding method is a procedure comprising the steps:
    (a) quantizing received code-bit channel-symbol values into digital data,
    (b) initializing by storing of digital data corresponding to code-bits into assigned memory locations as well as storing appropriate initialized digital data values at required locations including the memory locations that are shared by constituent subcodes to represent maximum a posteriori reliability estimates which are initialized to digital data representing equally likely estimates as also are the memory locations for extrinsic estimates and punctured code-bits,
    (c) applying of a recursive table-lookup decoding method for each constituent convolutional subcode while utilizing a set of pre-stored lookup tables and memory locations for each subcode,
    (d) applying more iterations of step (c) until a total of iterations has been completed,
    (e) extracting decoded binary estimates for the information-bits from the digital data at the shared memory locations representing the maximum a posteriori estimates by utilizing a most significant bit of the digital data, wherein the recursive table-lookup decoding method is a decoding method for a binary convolutional code of said finite blocklength value so as to produce:
    memory updated with digital data representing approximations for the maximum a posteriori reliability estimates for the number, equal to blocklength value, of information-bits;
    and memory updated with digital data representing approximations for the extrinsic reliability estimates for the number, equal to blocklength value of information-bits,
wherein the decoding method is a recursive table-lookup procedure comprising the steps:
    (a) initializing by storing of data into memory,
    (b) reading data from the memory,
    (c) reading data from a set of pre-stored lookup tables,
    (d) storing data read from lookup tables into the memory,
    (e) incrementing a memory location-address pointer,
when initially given memory stored with digital data representing:
    the channel-symbol reliability estimates for the number, equal to blocklength value, of parity-bits;
    previous extrinsic reliability estimates for the number, equal to blocklength value, of information-bits;
    and maximum a posteriori reliability estimates for the number, equal to blocklength value, of information-bits, which is a function of the previous extrinsic estimates, a priori estimates, and the channel-symbol estimates.

2. The decoding method of claim 1, wherein the locations of the data to be read out from lookup tables at some current recursion are determined from at least one of: data read from the lookup tables in the current recursion; data read from the lookup tables in previous recursions; data read from memory which was stored previously when read from one of the lookup tables in a previous recursion; and, data read from the memory which was initially stored.

3. The decoding method of claim 2, wherein the locations of the data to be read out from the lookup tables are digital address-words that are formed by appending together one or more digital data-words which are read out from the lookup tables and memory.

4. The decoding method of claim 1, wherein a number of recursions is twice the number, equal to blocklength value, of the convolutional code and the locations of the data to be read out from memory during a recursion are digital address-words that for the first number equal to blocklength value, of recursions will increment sequentially from an address-word value of zero to an address-word value of the number, equal to blocklength value, minus one and then for the second number, equal to blocklength value, of recursions will increment by decreasing sequentially from (the number, equal to blocklength value, minus one) to zero.

5. The decoding method of claim 1, wherein the number of recursions is twice the number, equal to blocklength value, of the convolutional code and the locations of the data to be read out from memory during a recursion are digital address-words that for the first number, equal to blocklength value, of recursions will increment with respect to a permuted ordering of the digital address-word values of zero to (the number, equal to blocklength value, minus one) and then for the second number, equal to blocklength value, of recursions will increment through a reverse of a permuted ordering.

6. The decoding method of claim 1, wherein a number of separate lookup tables in a set of lookup tables is a design parameter where separate lookup tables can be combined to form fewer lookup tables, or separate lookup tables can be split into several lookup tables.

7. The decoding method of claim 1, wherein the digital data-words that are pre-stored in the lookup tables is a design parameter, where a best mode of operation selects pre-stored data values based on selected inherent computational functions and selected inherent quantization functions that the lookup tables are approximating.

8. The lookup decoding method of claim 1, wherein a set of lookup tables are pre-stored with digital data-words, based on inherent computational functions and quantization functions such that the produced decoded data-words representing an approximation to the maximum a posteriori estimate are approximating a modified version of the maximum a posteriori estimate, including the modification that adds a sensitivity factor to forward state probabilities and reverse state probabilities within the inherent functions.

9. A hardware implemented recursive table-lookup decoding method comprising a recursive procedure of the steps:
 (a) initializing by storing of data into memory contained in said hardware,
 (b) reading data from said memory,
 (c) reading data from a set of pre-stored lookup tables,
 (d) storing data read from lookup tables into memory,
 (e) incrementing a memory location-address pointer, for the decoding of binary convolutional codes of fixed blocklength such as to produce a block of estimates which approximate maximum a posteriori estimates for information-bits, and to produce a block of estimates which approximate extrinsic estimates for the information-bits, wherein a binary convolutional code of finite number, equal to a blocklength value, is being decoded so as to produce: memory updated with digital data representing approximations for the maximum a posteriori reliability estimates for the number, equal to a blocklength value, of information-bits;
 and memory updated with digital data representing approximations for the extrinsic reliability estimates for the number, equal to a blocklength value, of information-bits, when initially given memory stored with digital data representing functions of:
 channel-symbol reliability estimates for the number, equal to a blocklength value, of parity-bits and the number, equal to a blocklength value, of information-bits; and
 a priori reliability estimates for the number, equal to a blocklength value, of information-bits.

10. The hardware implemented recursive table-lookup decoding method of claim 9, wherein the locations of the data to be read out from lookup tables at some current recursion are determined from at least one of:
 data read from lookup tables in the current recursion;
 data read from lookup tables in previous recursions;
 data read from memory which was stored previously when read from a lookup table in a previous recursion; and,
 data read from memory which was initially stored.

11. The hardware implemented recursive table-lookup decoding method of claim 10, wherein the locations of the data to be read out from lookup tables are digital address-words that are formed by appending together one or more digital data-words which are read out from lookup tables and memory.

12. The hardware implemented recursive table-lookup decoding method of claim 9, wherein the given data representing functions of the reliability estimates are given as: channel-symbol reliability estimates for parity-bits; some given appropriate estimates for the information-bits;
 and reliability estimates that are a combination of the given appropriate estimates for the information-bits, the a priori estimates for the information-bits, and the channel-symbol estimates for the information-bits.

13. The hardware implemented recursive table-lookup decoding method of claim 9, wherein the number of recursions is twice the number equal to a blocklength value, of the convolutional code and the location of the data to be read out from memory during a recursion are digital address-words that for the first number, equal to a blocklength value, of recursions will increment sequentially from an address-word value of zero to an address-word value of (number, equal to a blocklength value minus one) and then for the second number, equal to a blocklength value, of recursions will increment by decreasing sequentially from (number, equal to a blocklength value minus one) to zero.

14. The hardware implemented recursive table-lookup decoding method of claim 9, wherein the number of recursions is twice the number, equal to a blocklength value, of the convolutional code and the location of the data to be read out from memory during a recursion are digital address-words that for the first number, equal to blocklength value, of recursions will increment with respect to a permuted ordering of the digital address-word values of zero to (number, equal to blocklength value, minus one) and then for the second number, equal to blocklength value, of recursions will increment through a reverse of a permuted ordering.

15. The hardware implemented recursive table-lookup decoding method of claim 9, wherein the number of separate lookup tables in a set of lookup tables is a design parameter where separate lookup tables can be combined to form fewer lookup tables, or separate lookup tables can be split into several lookup tables.

16. The hardware implemented recursive table-lookup decoding method of claim 9, wherein the digital data-words that are pre-stored into the lookup tables is a design parameter, where a best mode of operation selects pre-stored data values based on selected inherent computational functions and selected inherent quantization functions that the lookup tables are approximating.

17. The hardware implanted recursive table-lookup decoding method of claim 9, wherein the set of lookup tables are pre-stored with digital data-words, based on inherent computational functions and quantization functions such that the produced decoded data-words representing an approximation to the maximum a posteriori estimate are approximating a modified version of the maximum a posteriori estimate, including the modification that adds a sensitivity factor to forward state probabilities and reverse state probabilities within inherent functions.

* * * * *